(12) United States Patent
Yokozeki

(10) Patent No.: US 6,243,319 B1
(45) Date of Patent: Jun. 5, 2001

(54) SEMICONDUCTOR MEMORY EQUIPPED WITH ROW ADDRESS DECODER HAVING REDUCED SIGNAL PROPAGATION DELAY TIME

(75) Inventor: Wataru Yokozeki, Kanagawa (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/689,676

(22) Filed: Oct. 13, 2000

(30) Foreign Application Priority Data

Jan. 7, 2000 (JP) .................................................. 11-005945

(51) Int. Cl.[7] ...................................................... G11C 8/00

(52) U.S. Cl. .................................. 365/230.06; 365/189.08

(58) Field of Search ........................... 365/230.06, 189.08

(56) References Cited

U.S. PATENT DOCUMENTS

| 5,047,983 | * | 9/1991 | Iwai et al. ........................ 365/230.06 |
| 5,610,874 | * | 3/1997 | Park et al. ....................... 365/230.06 |
| 5,889,725 | * | 3/1999 | Aikawa et al. .................. 365/230.06 |
| 6,055,203 | * | 4/2000 | Agarwal et al. ................ 365/230.06 |

* cited by examiner

Primary Examiner—Trong Phan
(74) Attorney, Agent, or Firm—Arent Fox Kintner Plotkin & Kahn, PLLC

(57) ABSTRACT

The output of a pre-decoder 10A is provided, on one side, to a main decoder 22 with the input of negative logic and on the other side, to a main decoder 21 with the input of positive logic through an inverting circuit 40. The number of gate stages from the output of the pre-decoder 10A to the output of the main decoder 21 is three which is equal to the number of gate stages from the output of the pre-decoder 10A to the output of the main decoder 22.

11 Claims, 17 Drawing Sheets

SEMICONDUCTOR MEMORY EQUIPPED WITH ROW ADDRESS DECODER HAVING REDUCED SIGNAL PROPAGATION DELAY TIME

BACKGROUND OF THE INVENTION

1. Field of the Invention

The present invention relates generally to a semiconductor memory, more particularly, to a semiconductor memory equipped with a row address decoder having a reduced signal propagation delay time.

2. Description of the Related Art

In a semiconductor memory, a row address is decoded by a decoder circuit to activate a single word line in a memory cell array.

FIG. 13 shows a decoder circuit for decoding a 2-bit row address with four 2-input NAND gates.

In this circuit scheme, $2^N$ N-input NAND gates are required in a case of an N-bit row address. The N-input NAND gates having $2^N$ outputs are disposed beside a memory cell array in order to decrease a total length of all interconnecting lines. However, when a value N is larger, the size of N-input NAND gate circuit increases, therefore the row pitch of memory cell is so larger that the memory density of the memory cell decreases.

Hence, a row address decoder circuit has been made to have a two stage configuration divided into a pre-decoder on the row address input side and a main decoder on the memory cell array side.

FIG. 14 shows a prior art 4-bit row address decoder circuit.

The pre-decoder 10 consists of a 2-bit decoder 11 for lower 2 bits A1 and A0 and a 2-bit decoder 12 for higher 2 bits A3 and A2. One of 4 outputs from the 2-bit decoder 11 and one of 4 outputs from the 2-bit decoder 12 are combined and all the combinations are provided to individual 2-input NAND gates in a main decoder 20.

The number of row address bits increases with increase in a storage capacity of a semiconductor memory, leading to a larger length of interconnecting lines between the pre-decoder 10 and the main decoder 20. Generally speaking, when a row address increases by one bit, the average length of interconnection lines between a pre-decoder and a main decoder increases to be twofold. When the length of interconnection line becomes twofold, each of a resistance value and a capacitance value thereof becomes twofold, causing a CR delay to be fourfold, with the result that rising and falling edge of a signal become gentle. Hence, an access time in a semiconductor memory increases to hinder a high-speed operation thereof.

FIG. 15 is a layout sketch of circuit blocks in a prior art semiconductor chip.

An address control circuit 30 includes an address buffer circuit, an address buffer register, and the pre-decoder, for receiving an address and providing a predecoded signal. The main decoder 20 provides a row select signal onto a word line of memory cell arrays MC1 to MC4.

Contents of memory cells connected to an activated word line in the memory cell arrays MC1 to MC4 are provided to a data I/O control circuit 33 or 34 through bit lines. Each of the data I/O control circuits 33 and 34 includes sense amplifiers amplifying signals on bit lines, and column switches selecting an amplified signal according to a column address.

In order to achieve a fast operation with reducing a propagation delay time, in the prior art, such a configuration as FIG. 16 was adopted. In FIG. 16, the address control circuit 30 of FIG. 15 is divided into address control circuits 30A and 30B, and an address control circuit 30A and a main decoder 20A are provided for the memory cell arrays MC1 and MC2, an address control circuit 30B and a main decoder 20B are provided for the memory cell arrays MC3 and MC4, and data I/O control circuits 33A, 34A, 33B and 34B are provided for the memory cell arrays MC1, MC2, MC3 and MC4, respectively.

However, there is an increase in the chip area of the semiconductor memory, resulting in higher cost compared with the configuration of FIG. 15.

This problem is solved by adopting a configuration shown in FIG. 17 in which the address control circuit 30 is disposed in a central portion, the data I/O control circuit 33 is disposed between the memory cell arrays MC1 and MC3, and the data I/O control circuit 34 is disposed between the memory cell arrays MC2 and MC4.

However, when the memory cell arrays MC1 to MC4 each become longer in a bit line direction in order to increase a storage capacity, the same problem as that of FIG. 15 arises. Moreover, when the data I/O control circuits are distributed as shown in FIG. 16 in order to solve the same problem as that of FIG. 15, the same problem as that of FIG. 16 then arises.

SUMMARY OF THE INVENTION

Accordingly, it is an object of the present invention to provide a semiconductor memory equipped with an address decoder circuit capable of reducing a decoding time without increasing in chip area.

In one aspect of the present invention, there is provided a semiconductor memory comprising a first memory cell array, having first word lines; a second memory cell array, arranged adjacent to the first memory cell array in a direction perpendicular to the first word lines, having second word lines; a pre-decoder, predecoding an address signal to provide a first predecoded signal; a first main decoder, further decoding the first predecoded signal to provide a first decoded signal to the first word lines; an inverting circuit, inverting a logic level of the first predecoded signal to generate a second predecoded signal; and a second main decoder, further decoding the second predecoded signal to provide a second decoded signal to the second word lines.

The term "memory" includes a memory circuit in a semiconductor device such as a MPU, a DSP or a memory device.

With this aspect, sum of CR values of interconnecting lines between a pre-decoder and a second main decoder is reduced, signal edges become steeper and the signal propagation delay time in the row decoder circuit is reduced, with the result that an access time in the semiconductor memory can be shorter.

Further, since the number of gate stages of the inverting circuit can be one, a chip area can be smaller than a case where a non-inverting circuit with two gate stages is adopted instead of the inverting circuit.

Other aspects, objects, and the advantages of the present invention will become apparent from the following detailed description taken in connection with the accompanying drawings.

DESCRIPTION OF THE PREFERRED EMBODIMENTS

Figure 1:
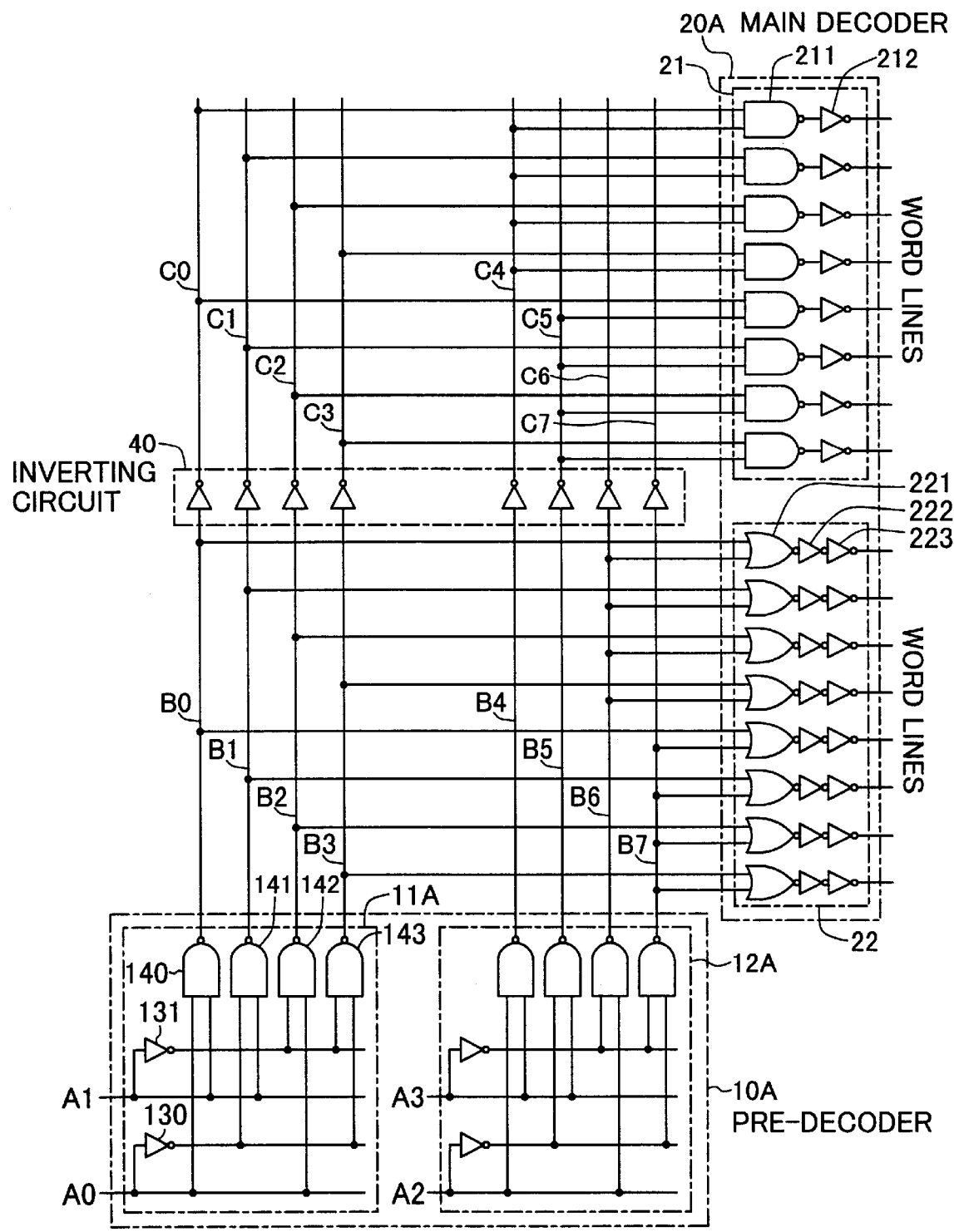
FIG. 1 is a diagram showing a 4-bit row address decoder circuit of a first embodiment according to the present invention.

Referring now to the drawings, wherein like reference characters designate like or corresponding parts throughout several views, preferred embodiments of the present invention are described below. A signal which is active low will be denoted with adding "*" to a reference character.

FIRST EMBODIMENT

FIG. 1 shows a 4-bit row address decoder circuit of a first embodiment according to the present invention.

This circuit includes a pre-decoder 10A, a main decoder 20A, and an inverting circuit 40.

The pre-decoder 10A includes a decoder 11A for lower 2 bits A1 and A2 of a row address, and a decoder 12A for higher 2 bits A3 and A4 of the row address.

In the decoder 11A, there are combined one of a signal A0 and an inverted signal thereof by an inverter 130 and one of a signal A1 and an inverted signal thereof by an inverter 131, and all the combinations thereof are provided to individual NAND gates 140 to 143. The outputs of the NAND gates 140 to 143 are connected to lines B0 to B3, respectively. With such a configuration, one of the lines B3 to B0 is low according to a value of the lower 2 row address bits A1 and A0 while the others of the lines B3 to B0 are high.

The decoder 12A has the same configuration as the decoder 11A, receives the higher 2 row address bits A3 and A2, and the four outputs thereof are connected to lines B4 to B7. One of the lines B7 to B4 is low according to a value of the higher 2 row address bits A3 and A2 while the others of the lines B7 to B4 are high.

The lines B0 to B7 are connected to lines C0 to C7 through individual inverters in the inverting circuit 40.

The main decoder 20A includes a main decoder 21 with the inputs of positive logic, and a main decoder 22 with the inputs of negative logic.

One of the lines B0 to B3 and one of the lines B6 and B7 are combined, and all the combinations thereof are connected to the inputs of individual 2-input NOR gates in the main decoder 22. In the example, the lines B0 and B6 are connected to the inputs of a NOR gate 221. The output of the NOR gate 221 is connected through inverters 222 and 223 to a word line in the memory cell array.

One of the lines C0 to C3 and one of the lines C4 and C5 are combined, and all the combinations thereof are connected to the inputs of individual 2-input NAND gates in the main decoder 21. In the example, the lines C0 and C4 are connected to the inputs of a NAND gate 211. The output of the NAND gate 211 is connected through inverter 212 to a word line in the memory cell array.

The number of gate stages from the outputs of the pre-decoder 10A to the outputs of the main decoder 21 is 3, which is equal to the number of gate stages from the outputs of the pre-decoder 10A to the outputs of the main decoder 22.

Figure 14:
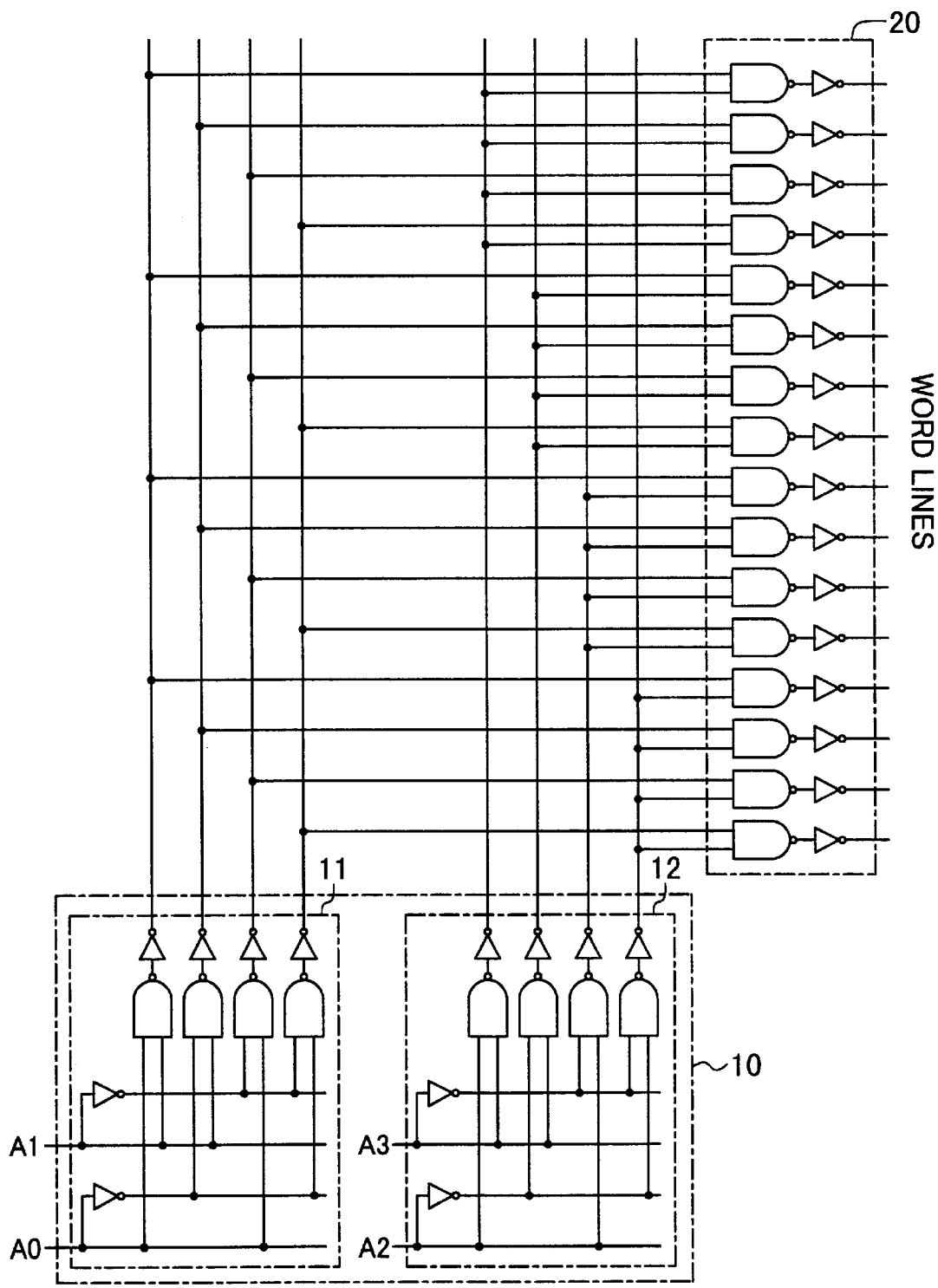
FIG. 14 is a diagram showing a prior art 4-bit row address decoder circuit.

With such a configuration, even the inverting circuit 40 is provided, the number of gate stages is the same as that in the case of FIG. 14, that is, the number of gate stages does not increase. Therefore, increase in gate delay due to increase in number of gate stages can be prevented.

A length of the lines connected to the outputs of the pre-decoder 10A is half that of the lines connected to the pre-decoder 10 of FIG. 14. Because of this, a resistance value and a capacitance value of the lines each are halves of the corresponding values in the prior art, and the CR delay time of the lines is equal to a quarter of the corresponding value in the prior art. This applies to the lines connected to the outputs of the inverting circuit 40 in a similar way. In actual case, for example, the line length from a node on the line C0 to an input of the NAND gate 211 can be neglected compared with that of the line C0.

With reduction in CR delay time, the rising and falling edges of signals becomes steeper, thereby enabling a shorter access time in a semiconductor memory.

Figure 2:
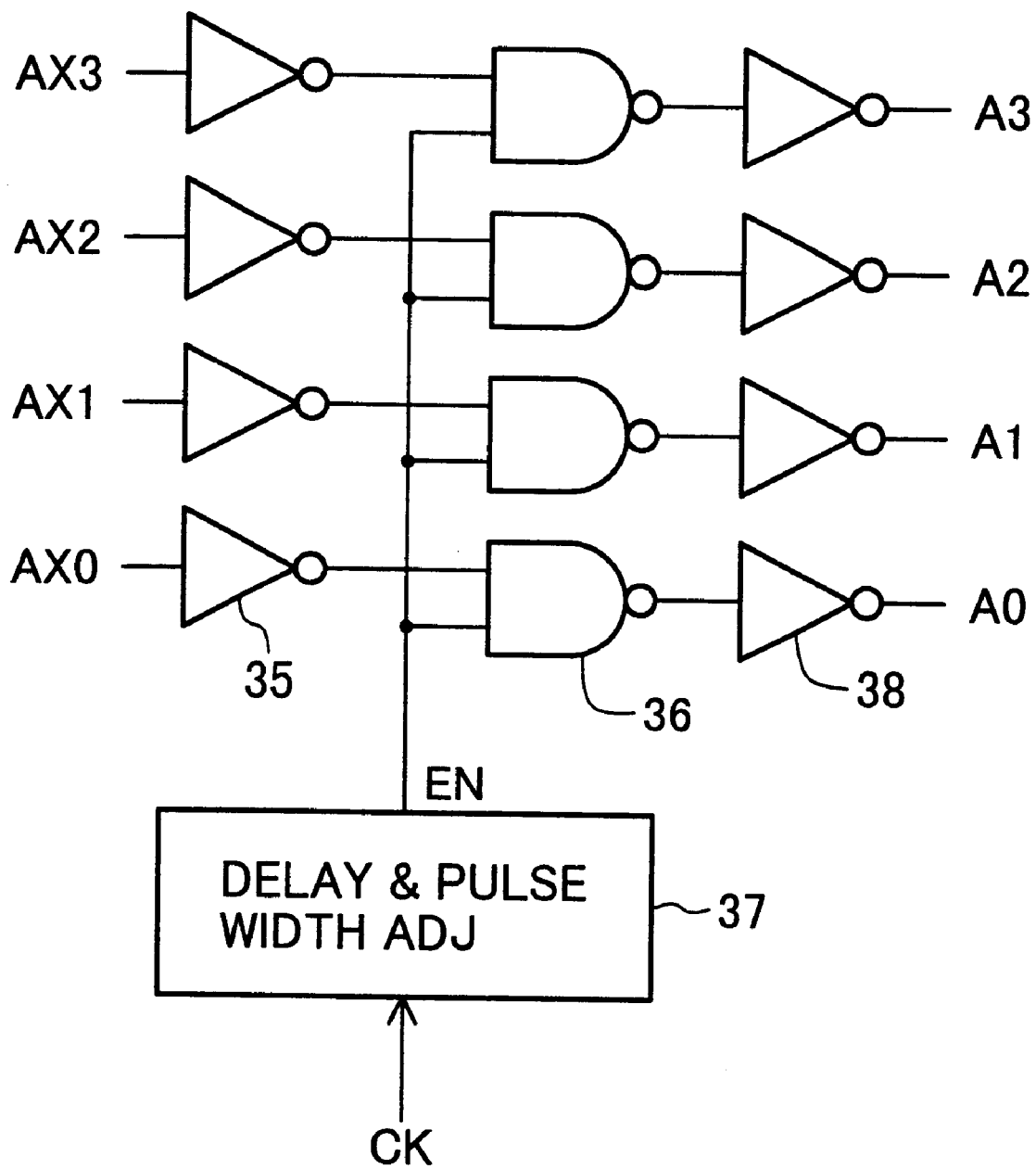
FIG. 2 is a diagram showing a pre-stage circuit for FIG. 1.

FIG. 2 shows a pre-stage circuit for the circuit of FIG. 1.

An address signal AX0 is externally provided to a first input of a NAND gate 36 through an address buffer circuit 35.

Figure 3:
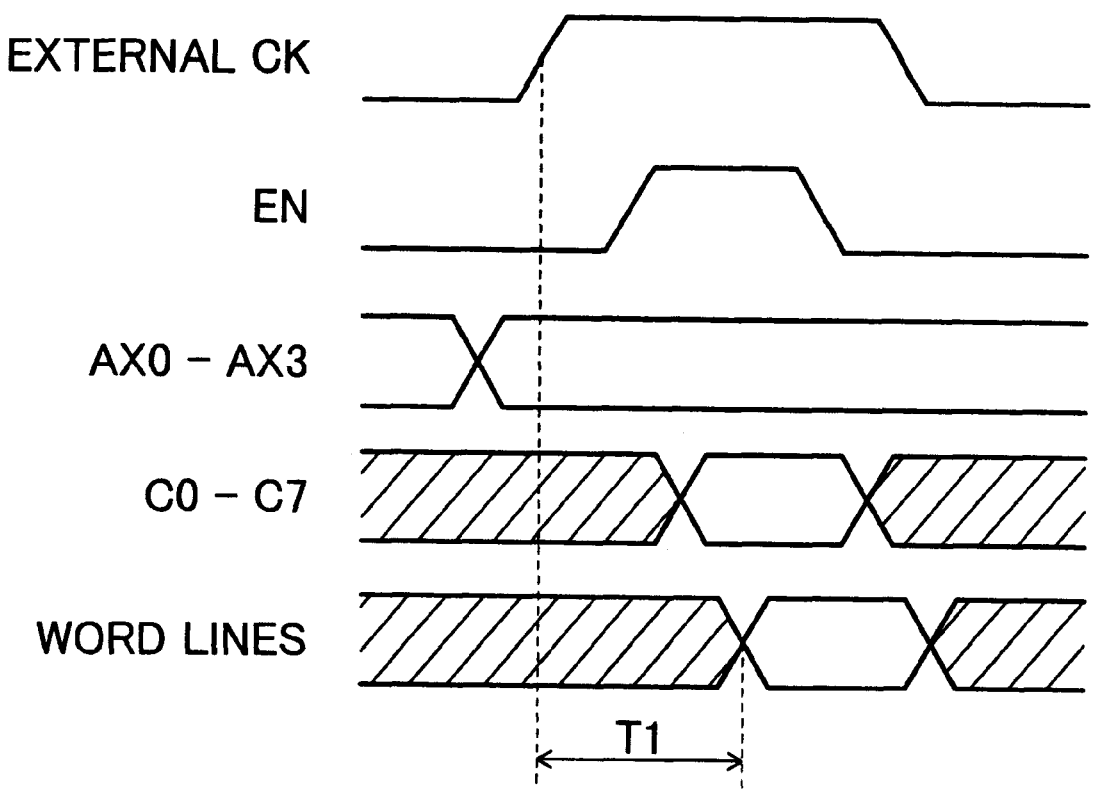
FIG. 3 is a time chart showing operation of the circuits of FIGS. 1 and 2.

On the other hand, a clock CK is externally provided to the second input of the NAND gate 36 through a delaying and pulse width adjusting circuit 37 for generating an enable signal EN as shown in FIG. 3. The output of the NAND gate 36 is inverted by the inverter 38 to get an address signal A0. Likewise, address signals AX1 to AX3 are externally provided to the circuit of FIG. 2 to get address signals A1 and A3.

FIG. 3 is a time chart showing operation of the circuits of FIGS. 1 and 2. A memory cell activation time is reduced by the enable signal EN with a short pulse width, resulting in decrease in power consumption.

Figure 4:
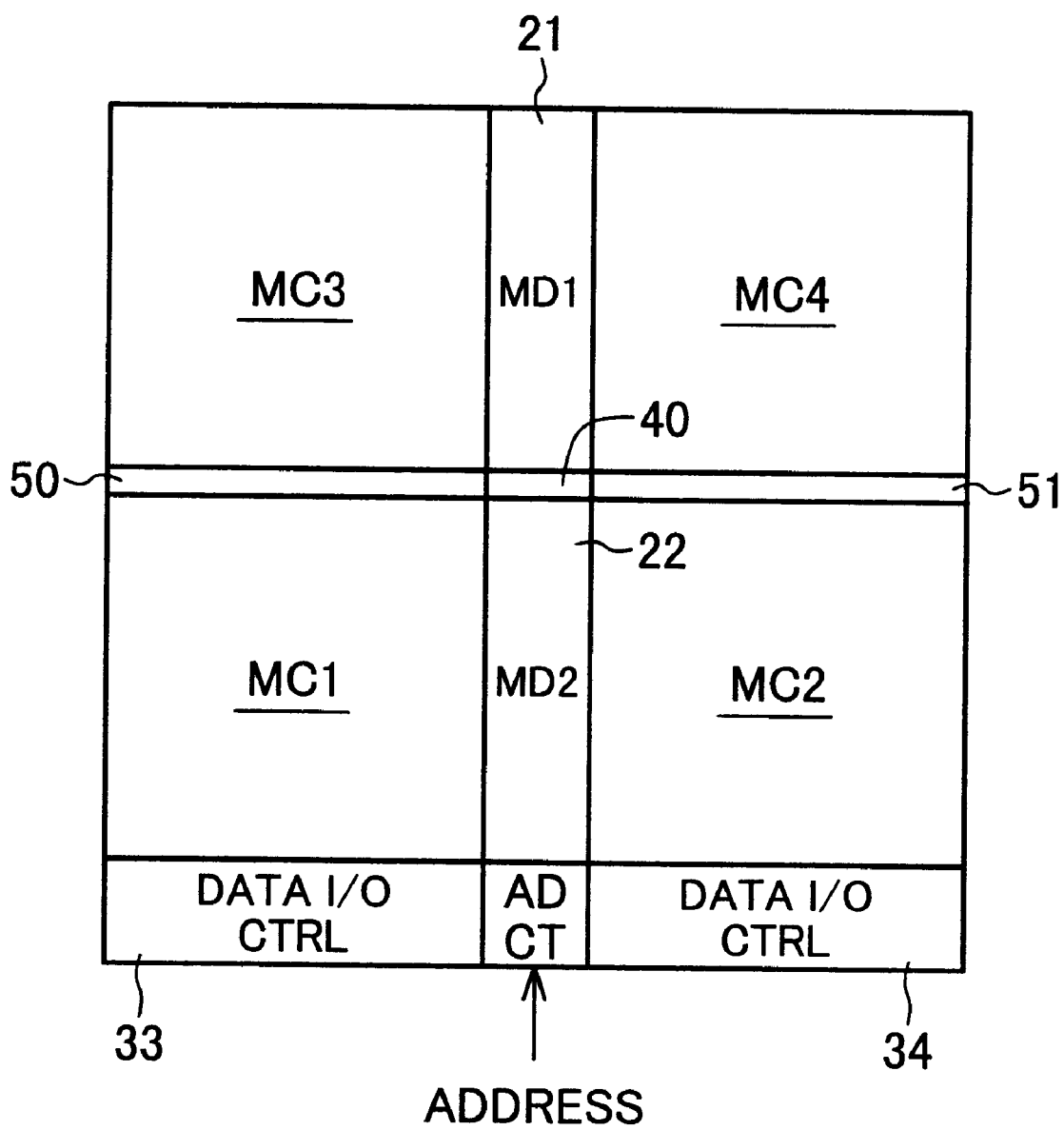
FIG. 4 is a layout sketch of circuit blocks in a semiconductor chip.
Figure 15:
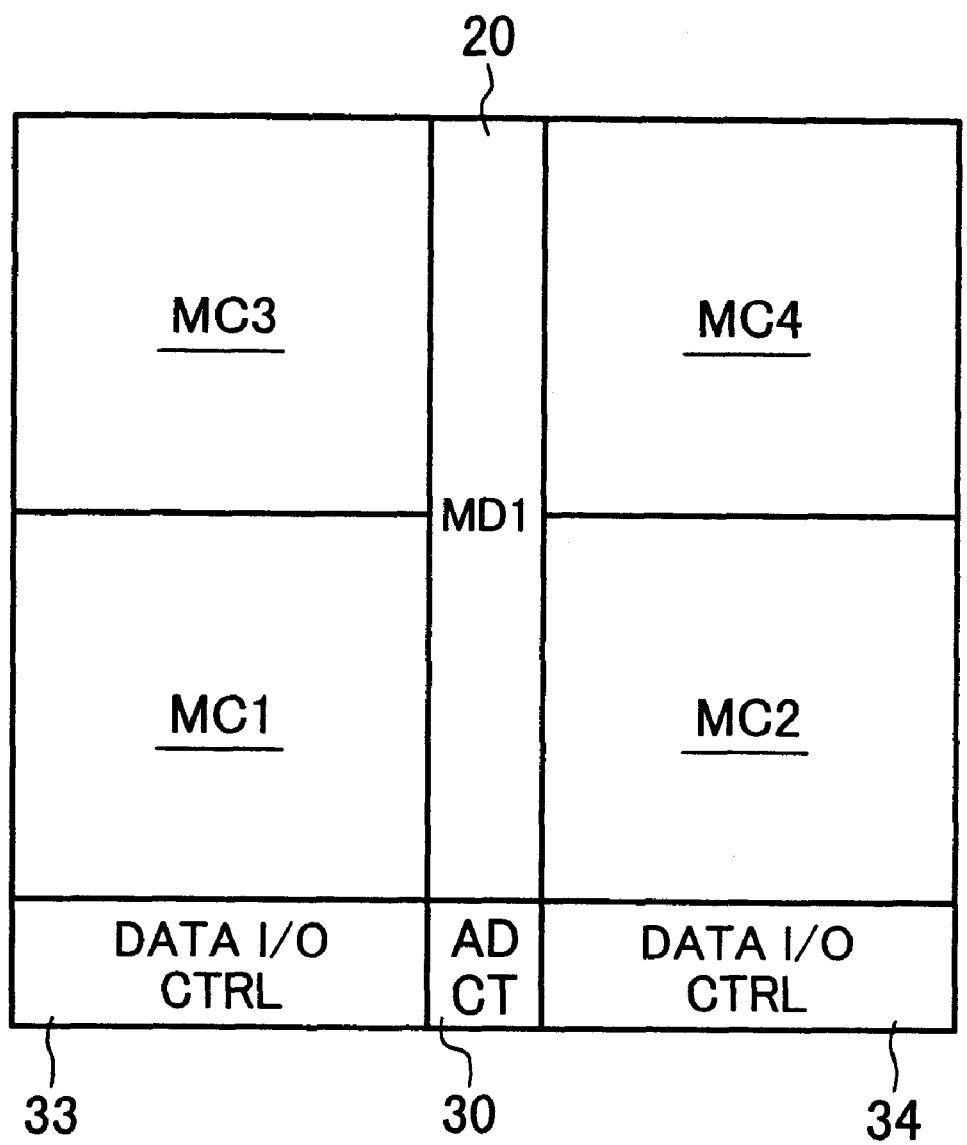
FIG. 15 is a layout sketch of circuit blocks in a prior art semiconductor chip.
Figure 16:
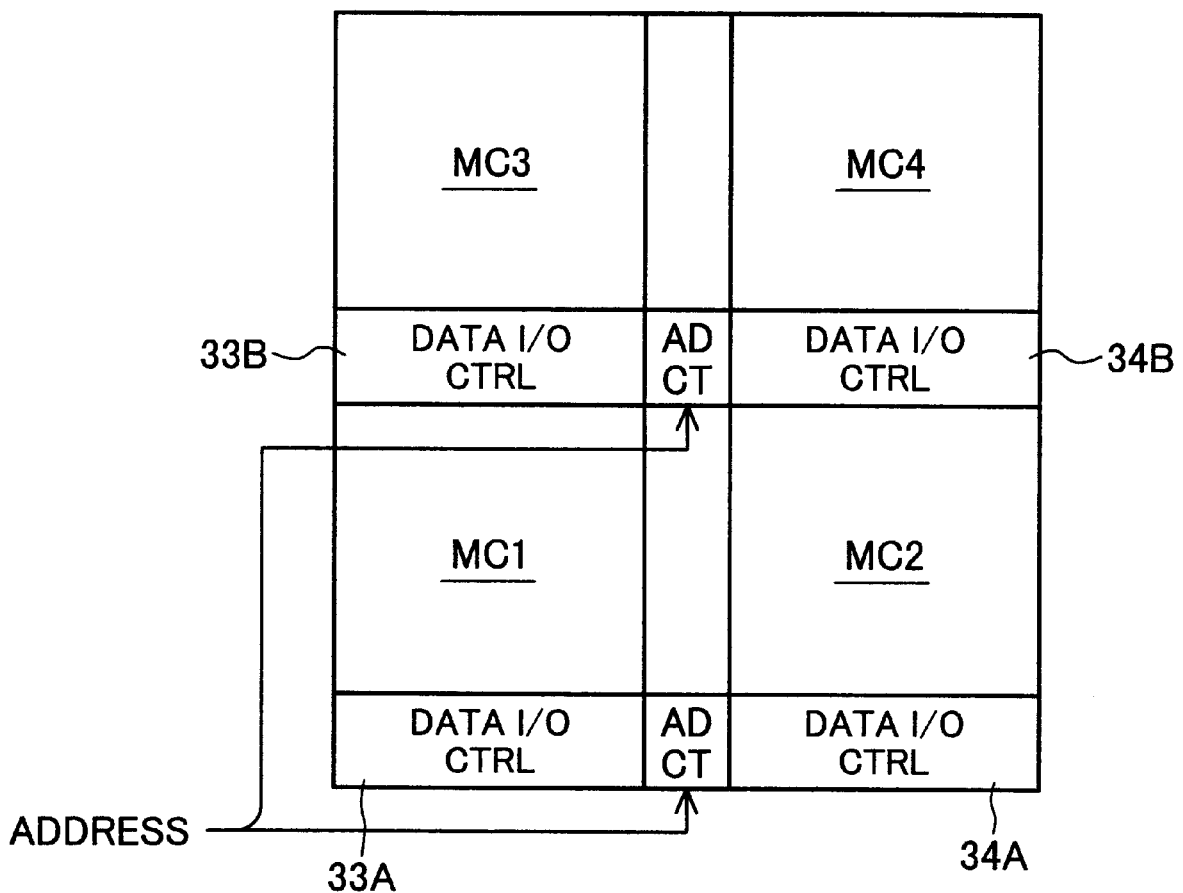
FIG. 16 is a layout sketch of circuit blocks in another prior art semiconductor chip.

FIG. 4 is a layout sketch of circuit blocks in a semiconductor chip, which corresponds to FIG. 15.

An address control circuit 30A includes the circuit of FIG. 2 and the pre-decoder (10A) of FIG. 1, receives an address, and outputs a predecoded signal. A main decoder 22(MD2) provides a row select signal onto one of the word lines in the memory cell array MC1 or MC2 disposed on both sides thereof. A main decoder 21(MD1) provides a row select signal onto one of the word lines in the memory cell array MC3 or MC4 disposed on both sides thereof.

Figure 5:
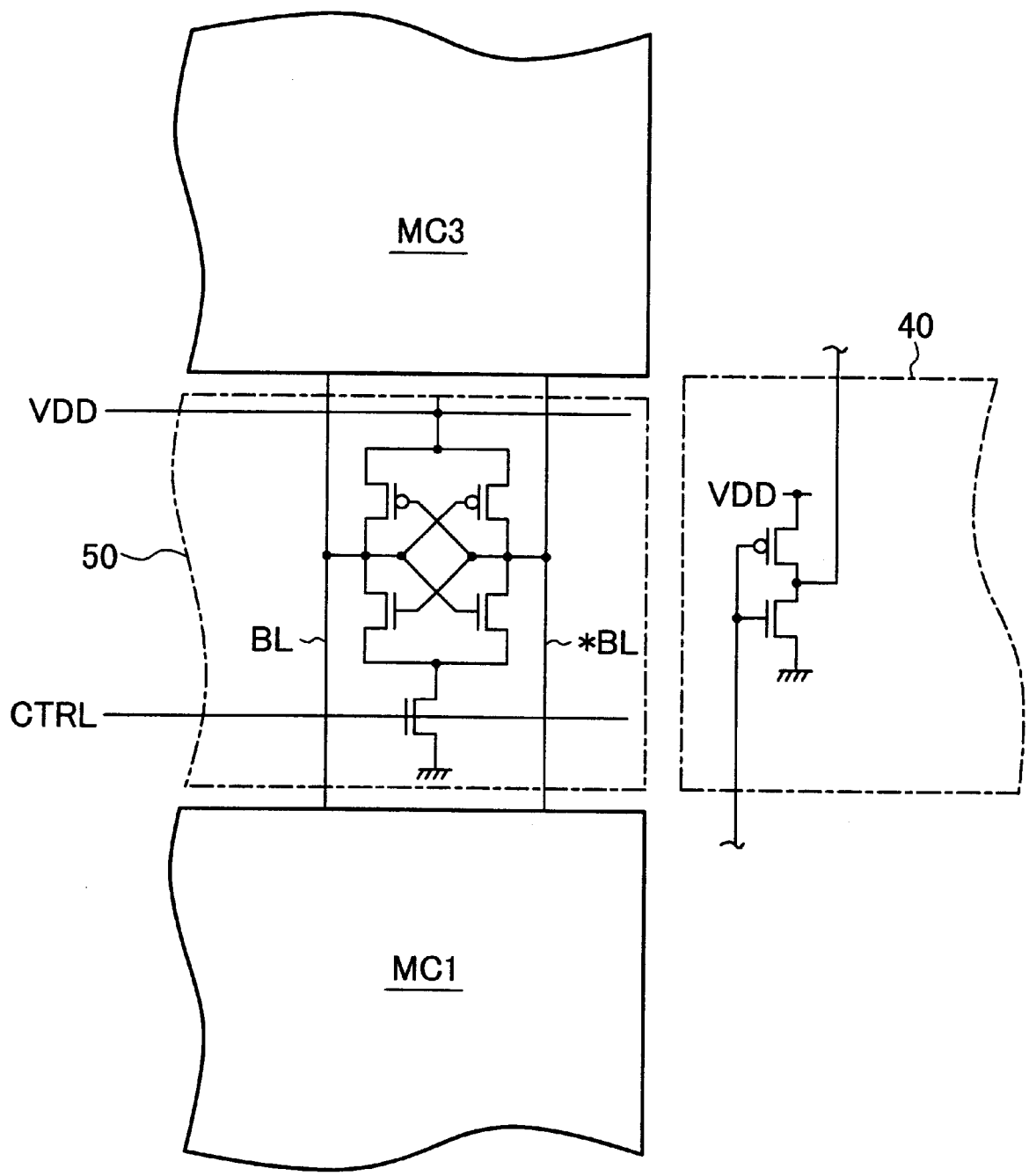
FIG. 5 is a diagram showing parts of the inverter circuit and the sense amplifier circuit of FIG. 4.

FIG. 5 is a diagram showing parts of the inverting circuit 40 and the minor sense amplifier circuit 50 of FIG. 4. In FIG. 5, BL and *BL indicate a pair of complementary bit lines, VDD a power supply line, CTRL a minor sense amplifier activation/deactivation control line, transistors marked with ○ and without ○ a PMOS transistor and an NMOS transistor, respectively. Between the memory cell arrays MC1 and MC3, the minor sense amplifier circuit 50 is provided, wherein a flip-flop minor sense amplifier is connected between the bit lines BL and *BL. In FIG. 4, between the memory cell arrays MC2 and MC4, too, there is provided a minor sense amplifier circuit 51 with the same configuration as that of the minor sense amplifier circuit 50.

With such a configuration, a time required for reading data from a memory cell array into a data I/O control circuit is reduced. Since the inverting circuit 40 is disposed between the minor sense amplifier circuits 50 and 51, increase in chip area due to placement of the inverting circuit 40 in addition to placement of the minor sense amplifier circuits 50 and 51 can be avoided.

Further, the memory cell arrays MC1 to MC4 with the same configurations as each other can be employed since the logic polarity of positive or negative in regard to the inputs of the main decoders 21 and 22 are reverse to each other according to location relative to the inverting circuit 40.

SECOND EMBODIMENT

Figure 6:
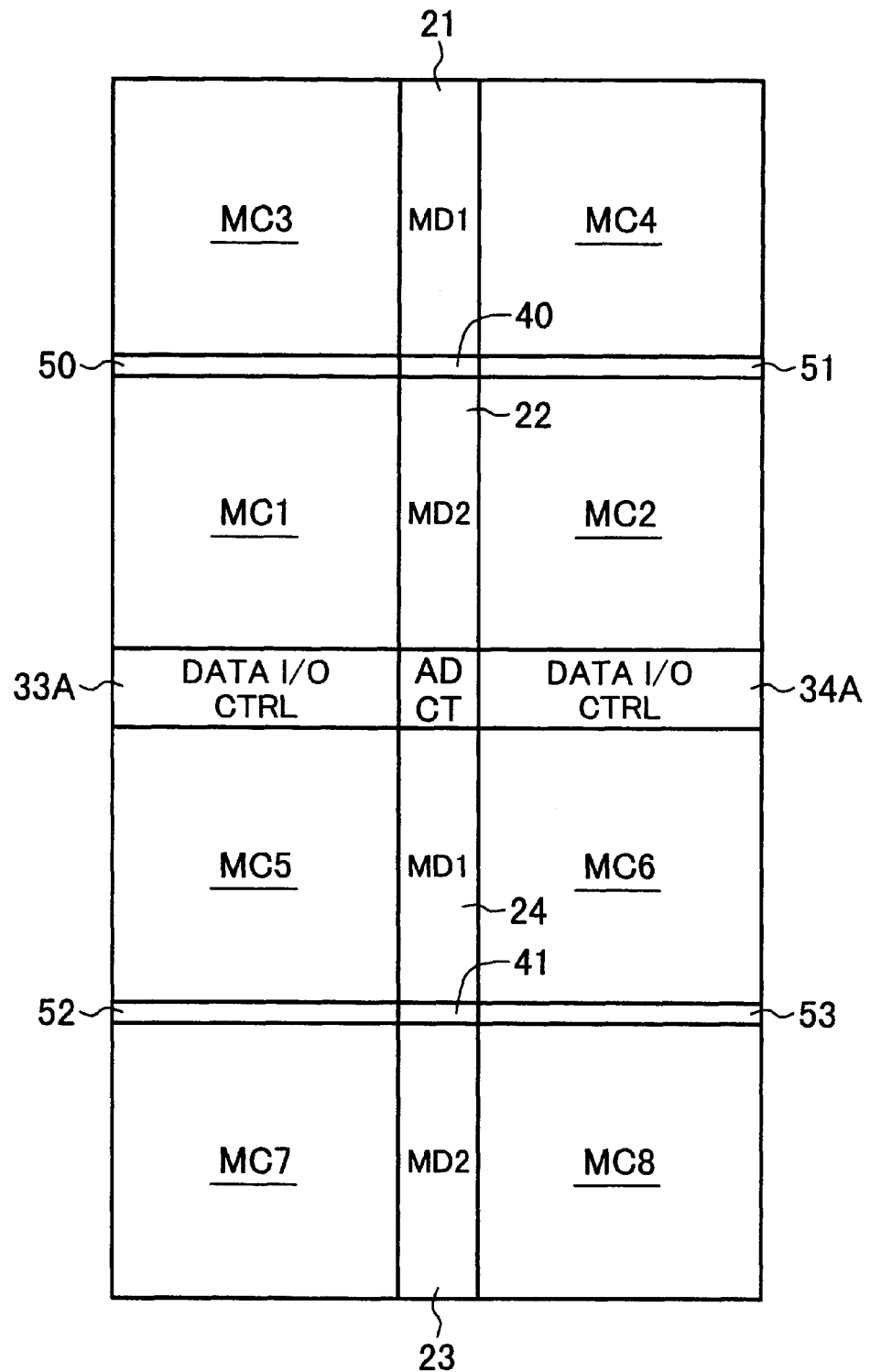
FIG. 6 is a layout sketch of circuit blocks in a semiconductor chip of a second embodiment according to the present invention.

FIG. 6 is a layout sketch of circuit blocks in a semiconductor chip of a second embodiment according to the present invention.

In this chip, on one side of an address control circuit 30B and data I/O control circuits 33A and 34A, there are disposed the memory cell arrays MC1 to MC4, the inverting circuit 40, the minor sense amplifier circuits 50 and 51 and the main decoders 21 and 22, while on the other side thereof, there are disposed memory cell arrays MC5 to MC8, an inverting circuit 41, minor sense amplifier circuits 52 and 53 and main decoders 23 and 24, wherein corresponding constituents on both sides are arranged in symmetry. The address control circuit 30B, and the data I/O control circuits 33A and 34A are shared by the circuits on both sides.

Figure 17:
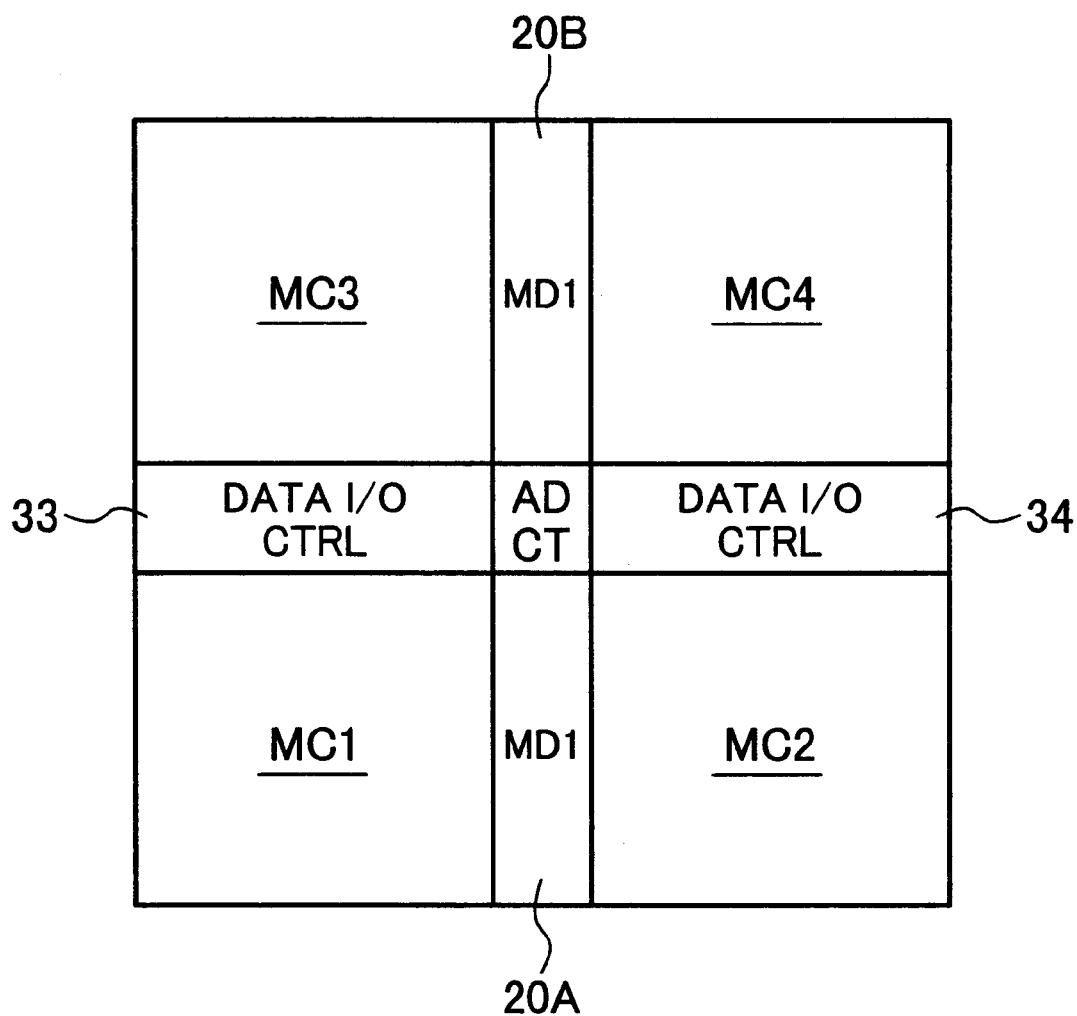
FIG. 17 is a layout sketch of circuit blocks in still another prior art semiconductor chip.

With such a configuration, the chip area can be smaller than the case where double the circuit of FIG. 17 are arranged adjacent to each other in parallel.

THIRD EMBODIMENT

Figure 7:
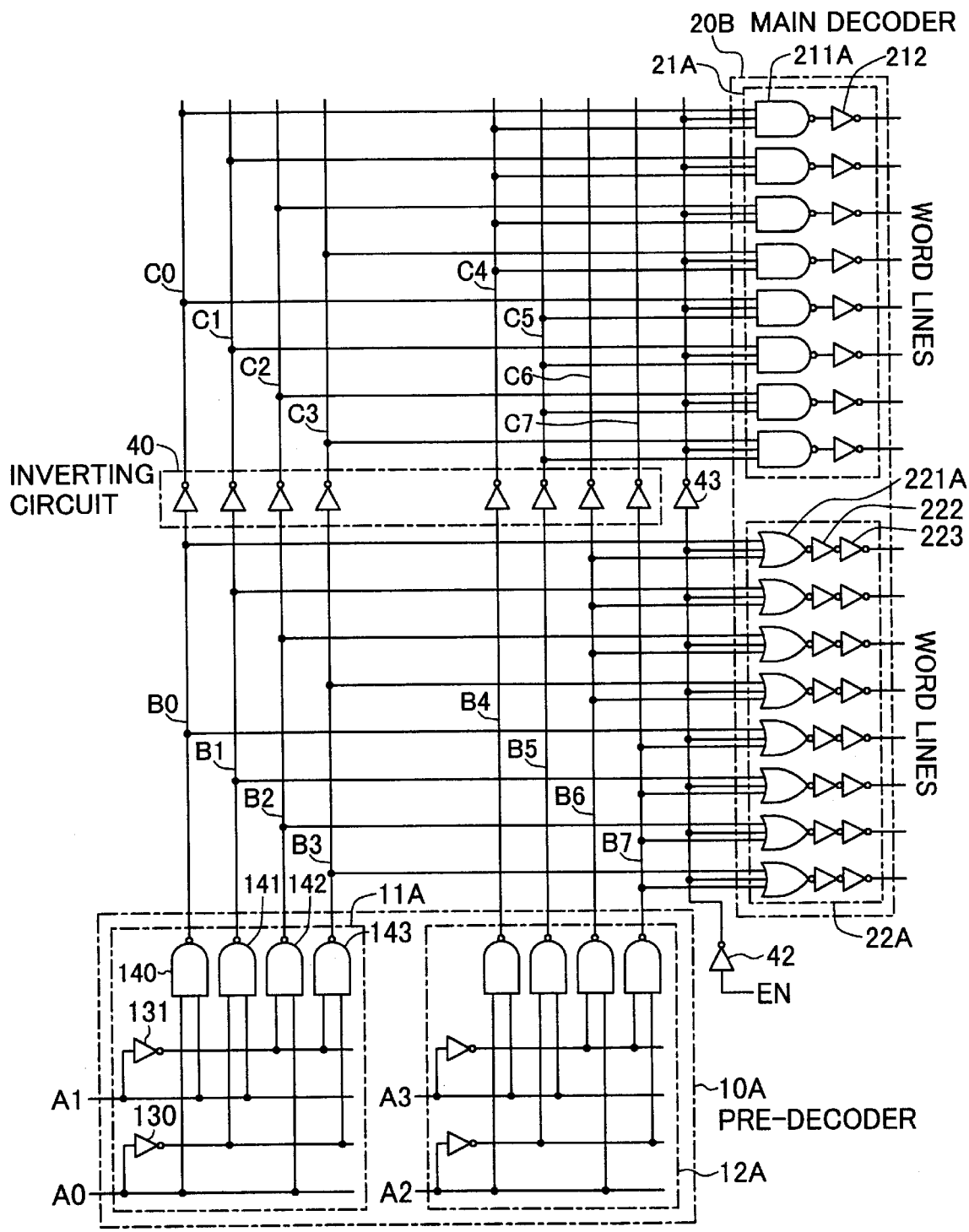
FIG. 7 is a diagram showing a 4-bit row address decoder circuit of a third embodiment according to the present invention.

FIG. 7 shows a 4-bit row address decoder circuit of a third embodiment according to the present invention.

In this circuit, the enable signal EN is provided through an inverter 42 to the NOR gates of a main decoder 22A, and the output of the inverter 42 is provided through an inverter 43 to the AND gates of a main decoder 21A. With such a configuration, the output of the main decoder 20B consisting of the main decoders 21A and 22A is effective only while the enable signal EN is high, therefore a memory cell activation time is reduced with the result that power consumption decreases. Note that the enable signal EN is generated by providing an external clock CK to the delaying and pulse width adjusting circuit 37 as shown in FIG. 2.

The inverters 42 and 43 are disposed adjacent to the pre-decoder 10A and the inverting circuit 40, respectively. The inverter 43 is used for not only corresponding to the different logic polarities of the inputs of the main decoders 21A and 22A but also decreasing a line delay to make signal edges steeper.

Figure 8:
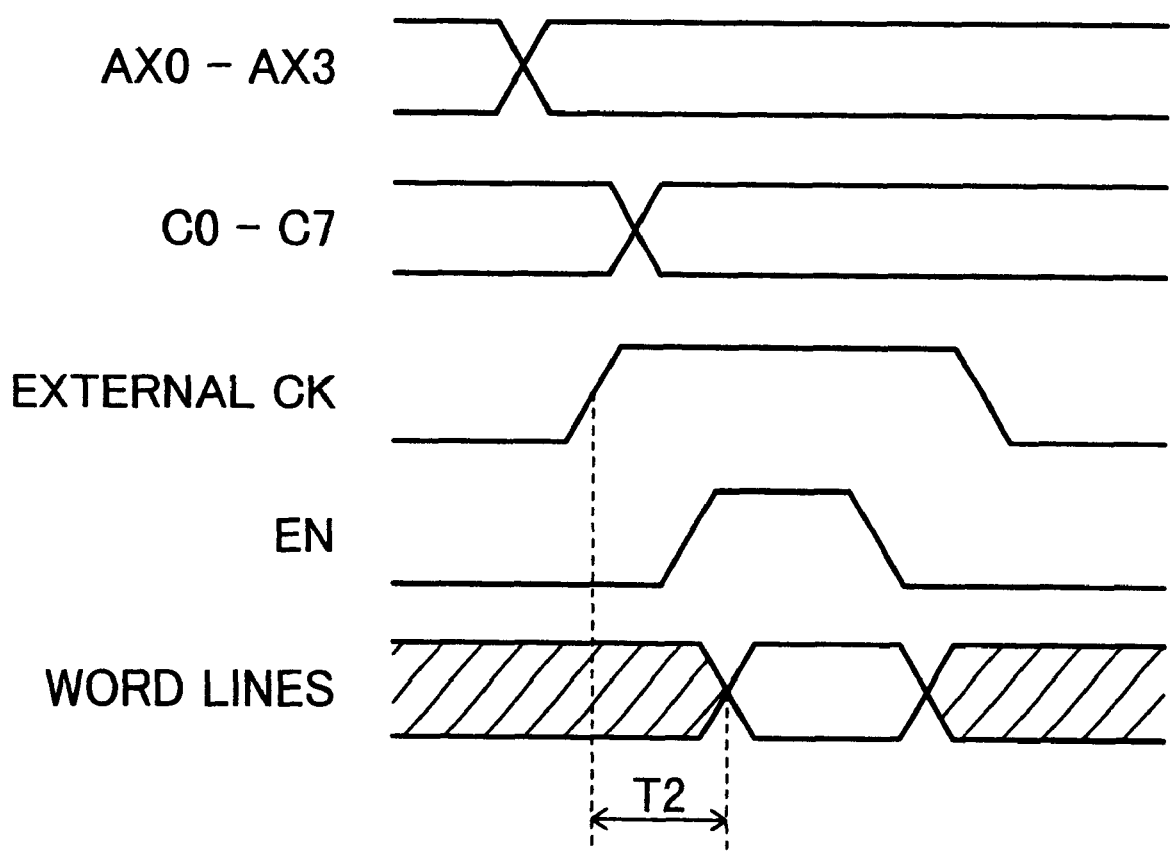
FIG. 8 is a time chart showing operations of the circuit of FIG. 7.

FIG. 8 is a time chart showing operation of the circuit of FIG. 7.

By providing the enable signal to the main decoder 20B, the time T2 from a rise of the external clock CK to a rise of a word line potential can be shorter than the time T1 of FIG. 3, thereby reducing an access time compared with the case of the first embodiment.

FOURTH EMBODIMENT

Figure 9:
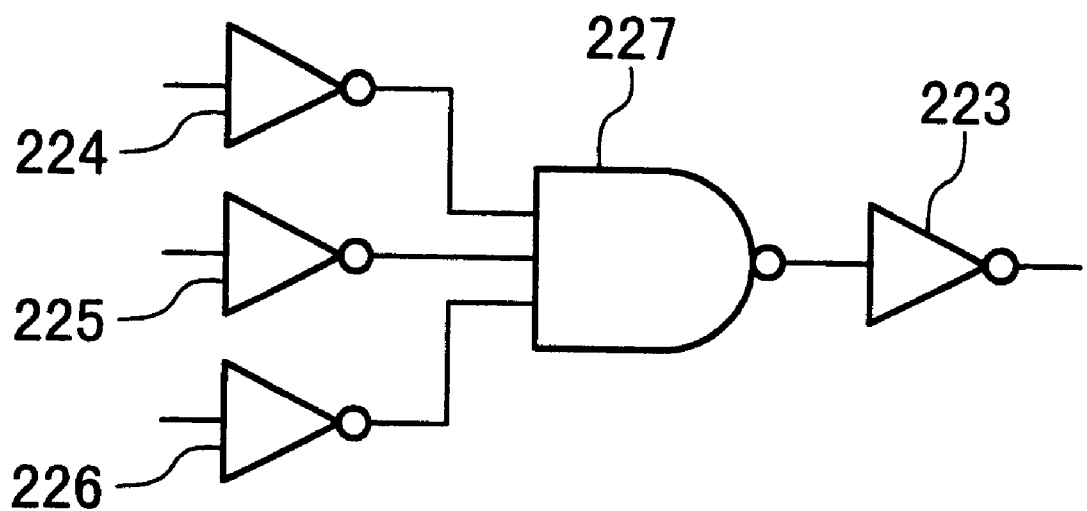
FIG. 9 is a diagram showing another circuit of one row in the main decoder of FIG. 7, of a fourth embodiment according to the present invention.

FIG. 9 is a diagram showing another circuit of one row in a main decoder 22A of FIG. 7, of the fourth embodiment according to the present invention.

In this circuit, the outputs of inverters 224 to 226 are provided through a NAND gate 227 to the inverter 223. The circuit consisting of the inverters 224 to 226 and the NAND gate 227 has the same function and the same number of gate stages as the circuit consisting of the NOR gate 221A and the inverter 222 of FIG. 7.

FIFTH EMBODIMENT

Figure 10:
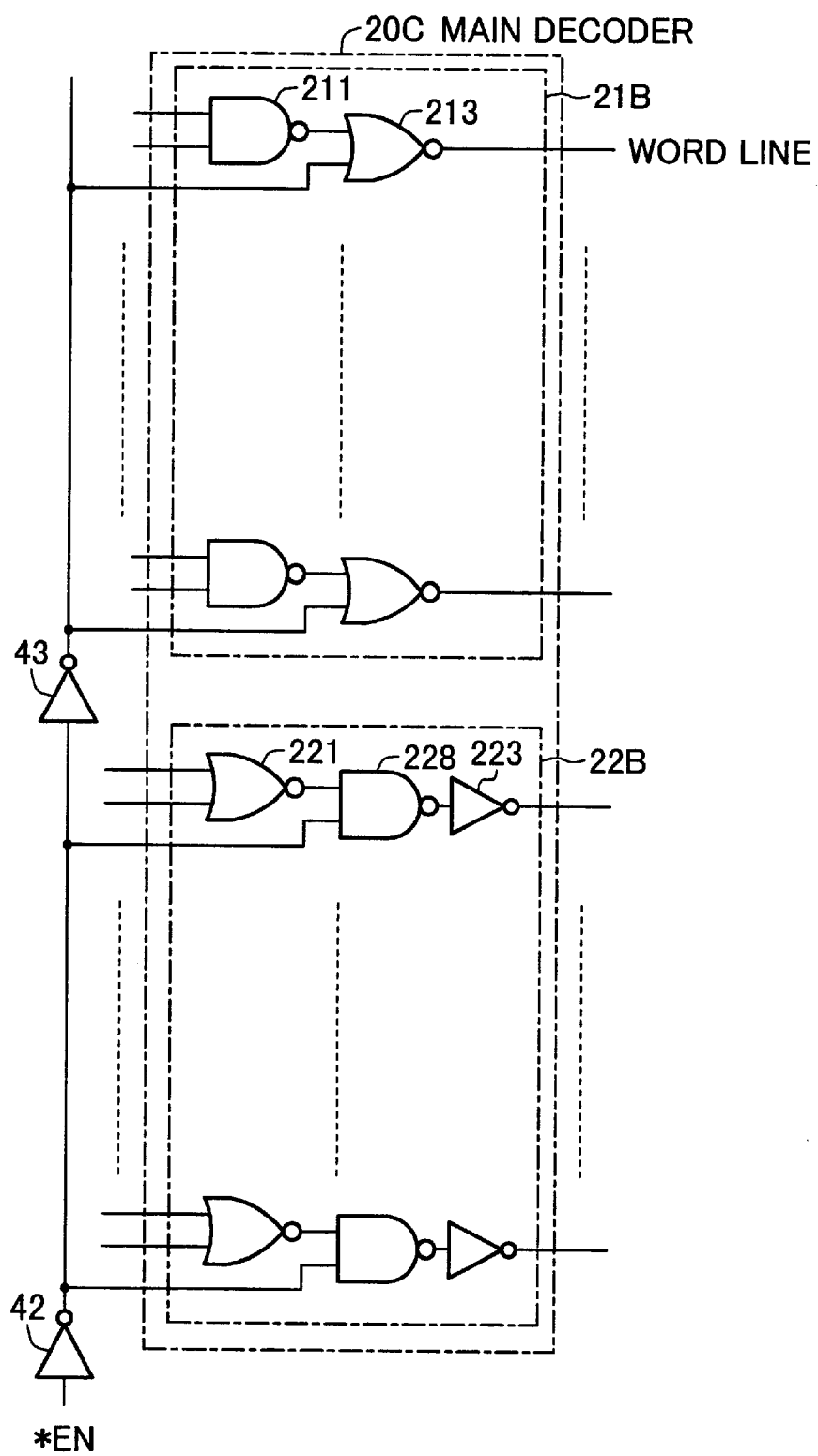
FIG. 10 is a diagram showing a main decoder circuit of a fifth embodiment according to the present invention.

FIG. 10 shows a main decoder 20C of a fifth embodiment according to the present invention.

In a main decoder 21B, the output of the 2-input NAND gate 211 is provided to a first input of a NOR gate 213, and to the second input of the NOR gate 213, the output of the inverter 43 is provided. The circuit consisting of the NAND gate 211 and the NOR gate 213 has the same function and the same number of gate stages as the circuit consisting of the NAND gate 211A and the inverter 212 of FIG. 7. Note that the enable signal EN obtained by inverting the enable signal EN of FIG. 7 is provided to the inverter 42.

While the NAND gate 211A is of three inputs, each of the NAND gate 211 and the NOR gate 213 is of two inputs, therefore the number of transistor stages cascaded between power supply potentials decreases, thereby enabling faster operation.

Likewise, in a main decoder 22B, the output of the 2-input NOR gate 221 is provided to a first input of a NAND gate 228, and to the second input of the NAND gate 228, the output of the inverter 42 is provided. The circuit consisting of the NOR gate 221 and the NAND gate 228 has the same function and the same number of gate stages as the circuit consisting of the NOR gate 221A and the inverter 222 of FIG. 7.

While the NOR gate 221A is of three inputs, each of the NOR gate 221 and the NAND gate 228 is of two inputs, therefore the number of transistor stages cascaded between power supply potentials decreases, thereby enabling faster operation.

SIXTH EMBODIMENT

Figure 11:
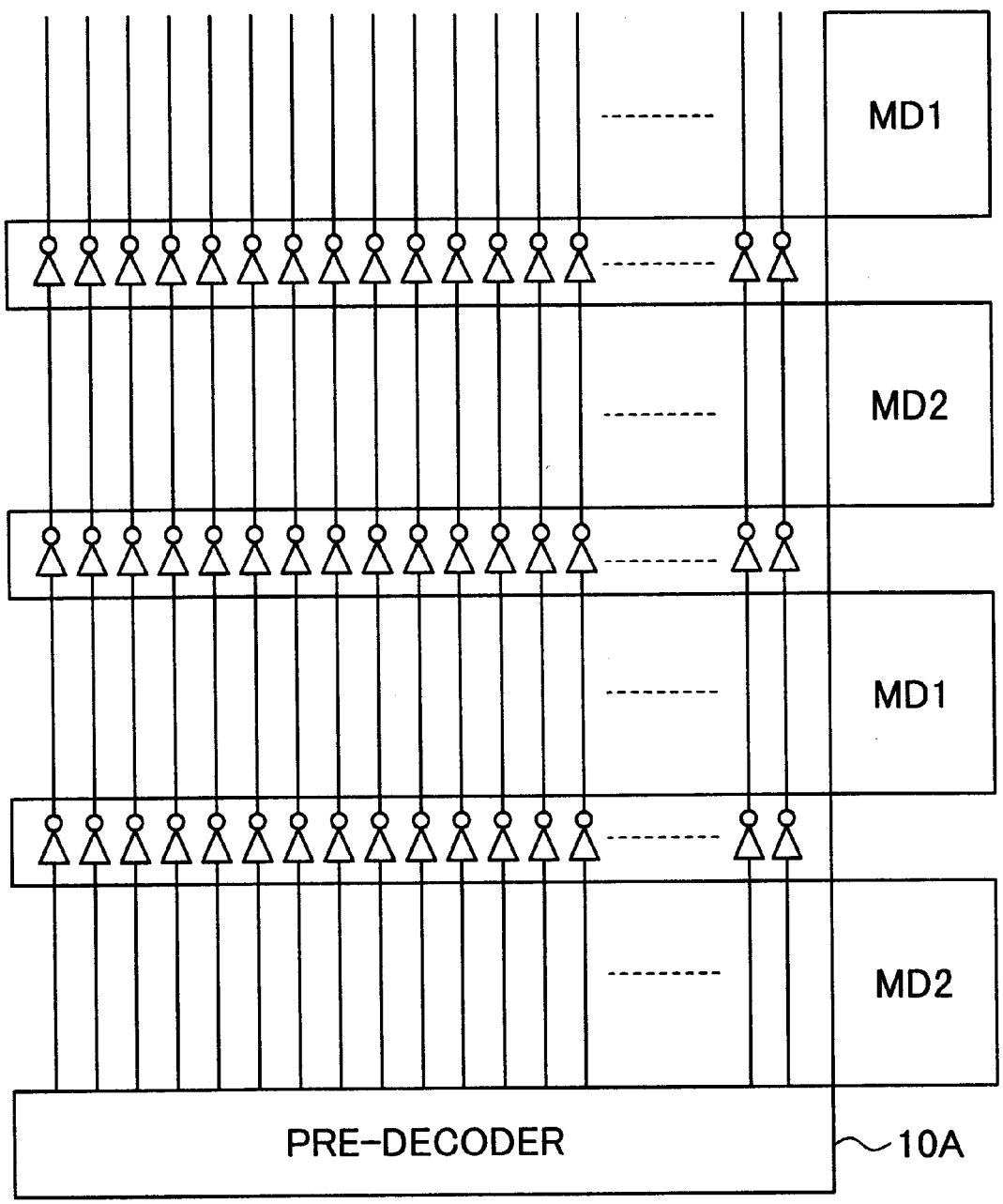
FIG. 11 is a block diagram showing a row address decoder circuit of a sixth embodiment according to the present invention.

FIG. 11 schematically shows a row address decoder circuit of a sixth embodiment according to the present invention.

In this circuit, three or more main decoders are provided for one pre-decoder 10A, and each inverting circuit is disposed on a side of an area between two main decoders adjacent to each other. The logic polarities of the inputs of adjacent two main decoders are reverse to each other. That is, the logic polarity of the input of MD1 or MD2 is positive and the other is negative.

Figure 12:
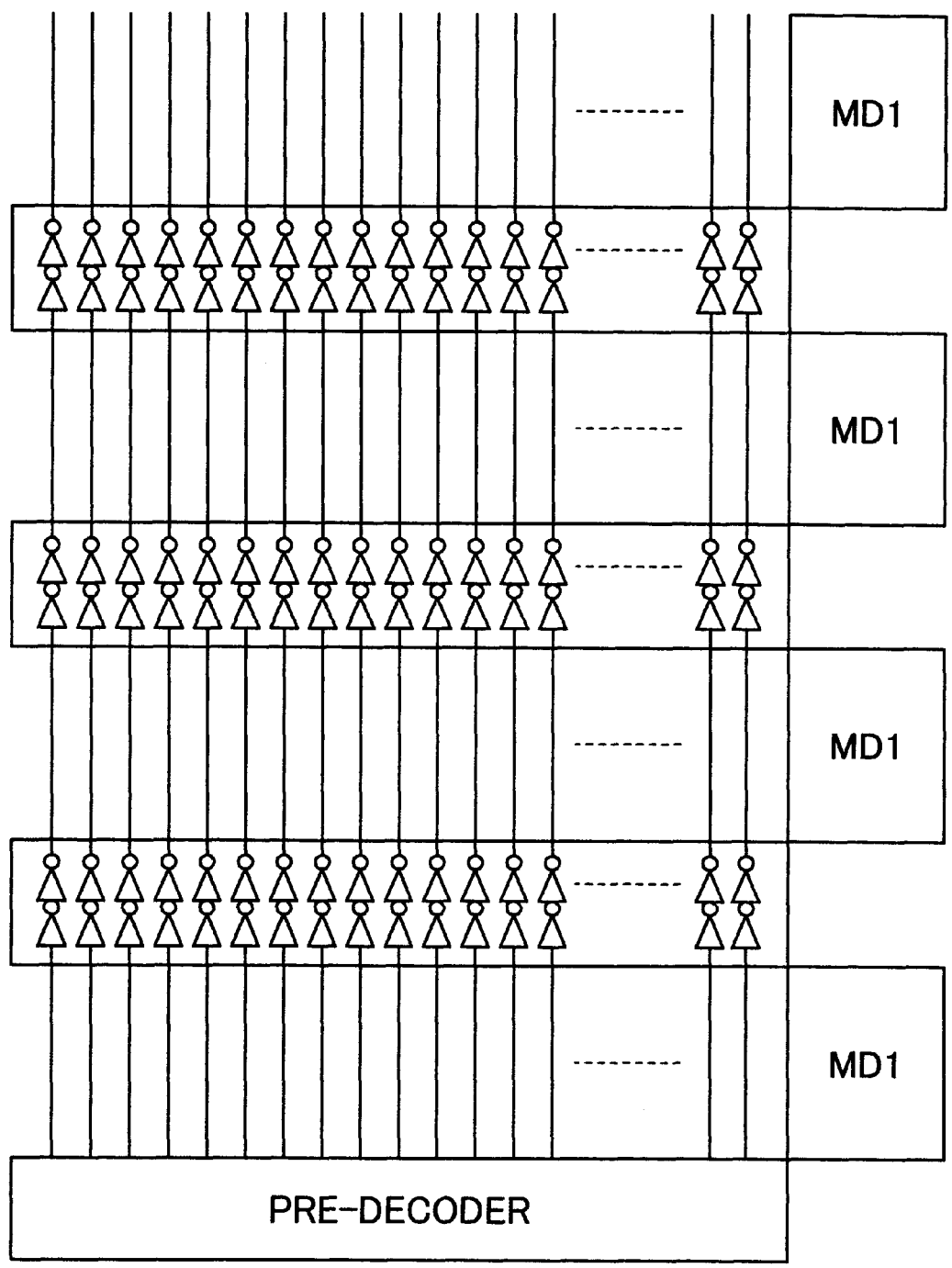
FIG. 12 is a block diagram showing a row address decoder circuit compared with FIG. 11.
Figure 13:
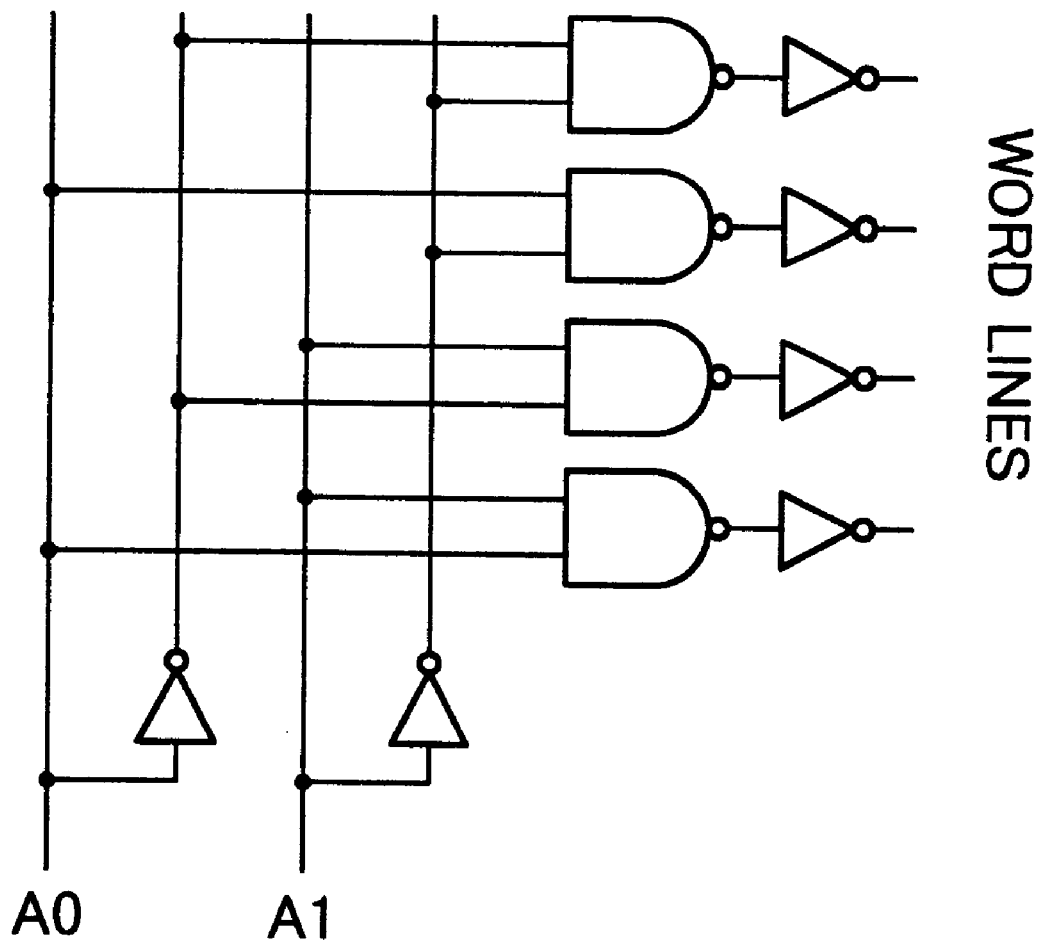
FIG. 13 is a diagram showing a prior art decoder circuit with four 2-input NAND gates for decoding a 2-bit row address.

FIG. 12 schematically shows a row address decoder circuit which is compared with that of FIG. 11.

In this circuit, since the logic polarity of the input of each main decoder MD1 is the same, a non-inverting circuit consisting of cascaded two inverters is required, therefore not only does the number of circuit elements increase, but also a gate delay time is longer.

Although preferred embodiments of the present invention has been described, it is to be understood that the invention is not limited thereto and that various changes and modifications may be made without departing from the spirit and scope of the invention.

What is claimed is:

1. A semiconductor memory comprising:

a first memory cell array, having first word lines;

a second memory cell array, arranged adjacent to said first memory cell array in a direction perpendicular to said first word lines, having second word lines;

a pre-decoder, predecoding an address signal to provide a first predecoded signal;

a first main decoder, further decoding said first predecoded signal to provide a first decoded signal to said first word lines;

an inverting circuit, inverting a logic level of said first predecoded signal to generate a second predecoded signal; and a second main decoder, further decoding said second predecoded signal to provide a second decoded signal to said second word lines.

2. The semiconductor memory according to claim 1, wherein an input of said first main decoder has a logic polarity which is reverse to that of said second main decoder.

3. The semiconductor memory according to claim 1, wherein said inverting circuit is disposed on a side of an area between said first and second main decoders.

4. The semiconductor memory according to claim 2, wherein said inverting circuit is disposed on a side of an area between said first and second main decoders.

5. The semiconductor memory according to claim 3, further comprising a minor sense amplifier circuit, amplifying a difference in potential between bit lines of a pair, disposed between said first and second memory cell arrays.

6. The semiconductor memory according to claim 4, further comprising a minor sense amplifier circuit, amplifying a difference in potential between bit lines of a pair, disposed between said first and second memory cell arrays.

7. The semiconductor memory according to claim 2, further comprising:

a first line for providing a first enable signal to said first main decoder;

a second line for providing a second enable signal to said second main decoder; and an inverter, connected between said first and second line, converting said first enable signal into said second enable signal.

8. The semiconductor memory according to claim 3, further comprising:

a first line for providing a first enable signal to said first main decoder;

a second line for providing a second enable signal to said second main decoder; and an inverter, connected between said first and second line, converting said first enable signal into said second enable signal.

9. The semiconductor memory according to claim 4, further comprising:

a first line for providing a first enable signal to said first main decoder;

a second line for providing a second enable signal to said second main decoder; and an inverter, connected between said first and second line, converting said first enable signal into said second enable signal.

10. The semiconductor memory according to claim 8, wherein said inverter is disposed beside said inverting circuit.

11. The semiconductor memory according to claim 9, wherein said inverter is disposed beside said inverting circuit.

* * * * *